United States Patent
Sasabayashi

(10) Patent No.: US 10,680,191 B2
(45) Date of Patent: Jun. 9, 2020

(54) DISPLAY DEVICE AND ELECTRONIC DEVICE

(71) Applicant: Japan Display Inc., Tokyo (JP)

(72) Inventor: Takashi Sasabayashi, Tokyo (JP)

(73) Assignee: Japan Display Inc., Tokyo (JP)

(*) Notice: Subject to any disclaimer, the term of this patent is extended or adjusted under 35 U.S.C. 154(b) by 87 days.

(21) Appl. No.: 15/997,814

(22) Filed: Jun. 5, 2018

(65) Prior Publication Data

US 2018/0375044 A1 Dec. 27, 2018

(30) Foreign Application Priority Data

Jun. 23, 2017 (JP) .................. 2017-123035

(51) Int. Cl.
| | |
|---|---|
| H01L 51/00 | (2006.01) |
| H01L 27/12 | (2006.01) |
| G09G 3/3225 | (2016.01) |
| H01L 51/52 | (2006.01) |
| H01L 27/32 | (2006.01) |

(52) U.S. Cl.
CPC ....... *H01L 51/0097* (2013.01); *G09G 3/3225* (2013.01); *H01L 27/1214* (2013.01); *H01L 27/1218* (2013.01); *H01L 51/5203* (2013.01); *H01L 51/5243* (2013.01); *H01L 51/5253* (2013.01); *G02F 2201/123* (2013.01); *H01L 27/3267* (2013.01); *H01L 51/5246* (2013.01); *H01L 2251/5338* (2013.01)

(58) Field of Classification Search
CPC ............ H01L 51/0097; H01L 51/5203; H01L 51/5343; H01L 51/5253; H01L 27/1214; H01L 27/1218; H01L 27/3267
See application file for complete search history.

(56) References Cited

U.S. PATENT DOCUMENTS

| | | | | |
|---|---|---|---|---|
| 8,570,300 B2* | 10/2013 | Ikeda | ................ | G06F 3/044 345/174 |
| 8,759,126 B2* | 6/2014 | Kuranaga | ........ | G02F 1/133351 257/88 |
| 8,830,429 B2* | 9/2014 | Ishigaki | ........... | G02F 1/136227 349/138 |
| 8,913,207 B2* | 12/2014 | Watanabe | ........... | G02B 6/0088 349/58 |

(Continued)

FOREIGN PATENT DOCUMENTS

JP 2014-095745 A 5/2014

*Primary Examiner* — Ricardo Osorio
(74) *Attorney, Agent, or Firm* — Michael Best & Friedrich LLP

(57) ABSTRACT

A display device includes: an array substrate having a flexible substrate and a pixel circuit over the flexible substrate; a first supporting film under the array substrate; a second supporting film over the array substrate; and a member under the first supporting film with an adhesive layer sandwiched therebetween. The member includes a first film and a second film having a different thermal expansion coefficient respectively. The first film and the second film are respectively a first metal film containing a metal film and a second metal film containing a second metal, and the first metal and the second film are independently selected from copper, nickel, zinc, manganese, iron, cobalt, aluminum, tin, lead, and silver.

21 Claims, 15 Drawing Sheets

(56) References Cited

U.S. PATENT DOCUMENTS

| | | | |
|---|---|---|---|
| 9,025,106 B2* | 5/2015 | Miyazaki | G02B 6/0088 349/58 |
| 2013/0071598 A1* | 3/2013 | Byeon | G02F 1/1336 428/57 |
| 2014/0092342 A1* | 4/2014 | Franklin | G02B 6/0088 349/62 |
| 2014/0125216 A1 | 5/2014 | Sasaki et al. | |
| 2014/0176850 A1* | 6/2014 | Kim | F21V 15/04 349/58 |
| 2014/0376237 A1* | 12/2014 | Hwang | B29C 45/1679 362/382 |

\* cited by examiner

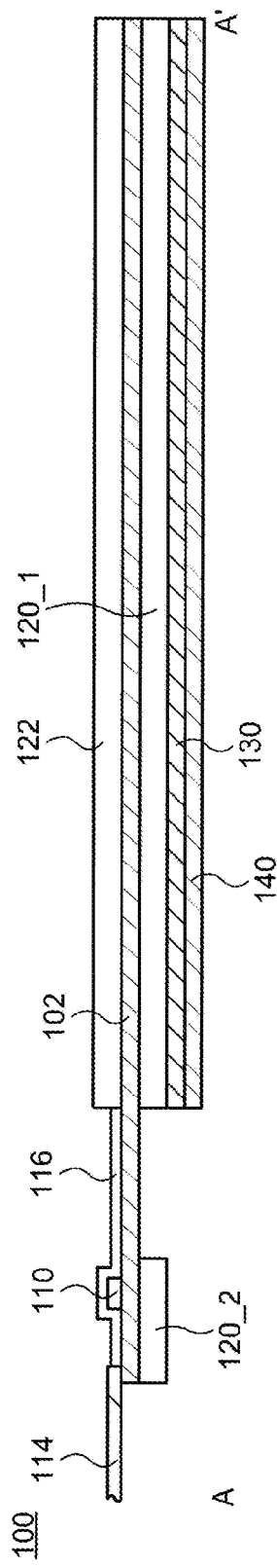
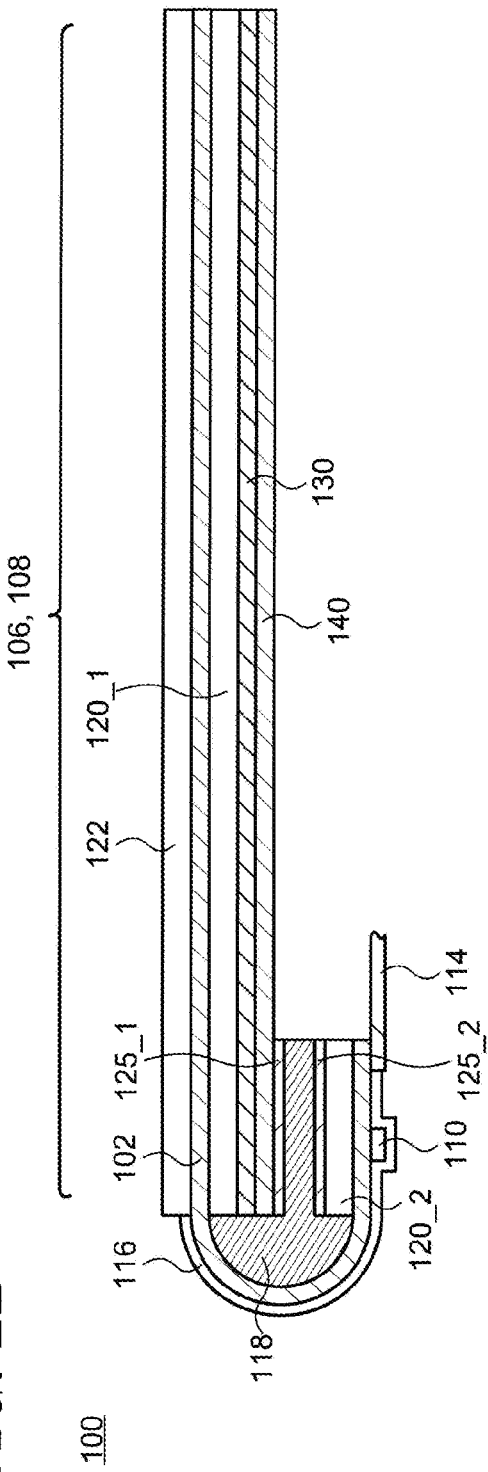
FIG. 2A
FIG. 2B

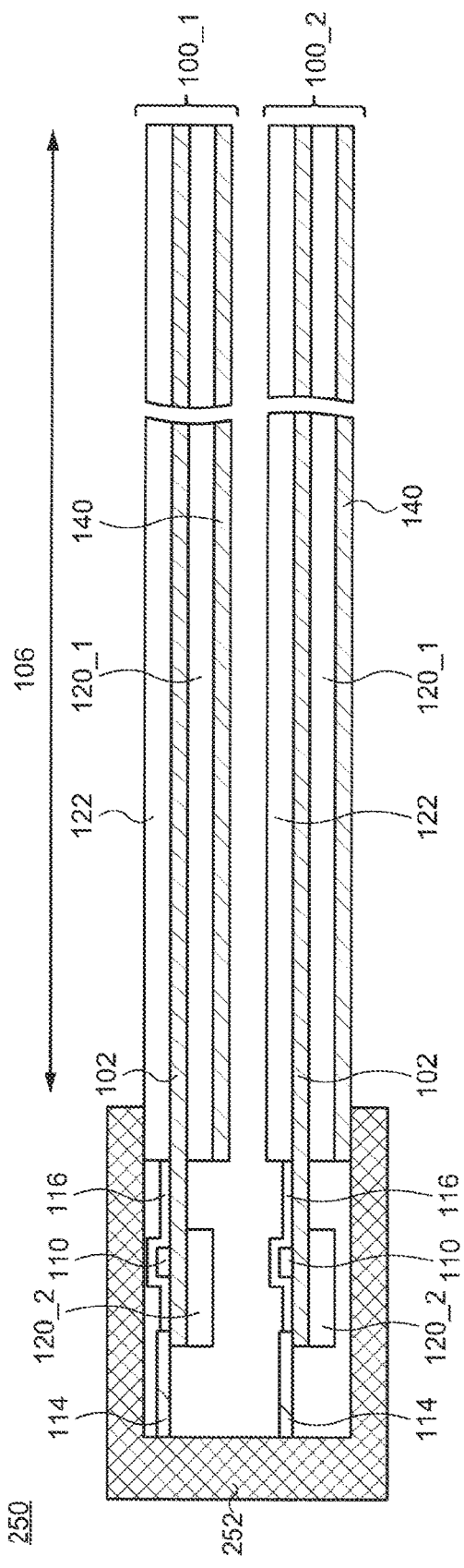
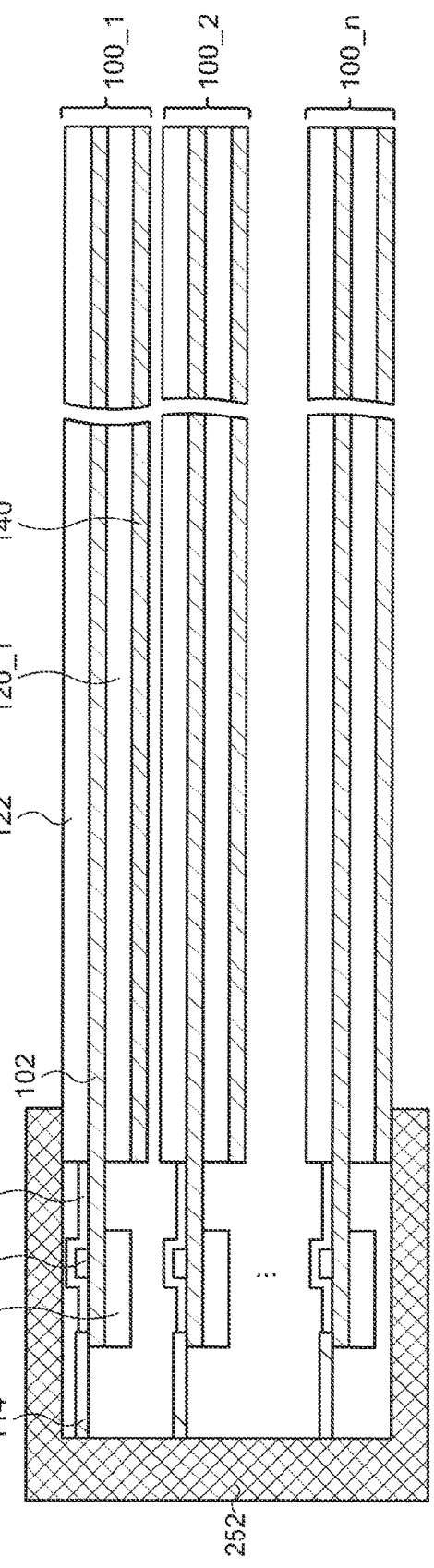

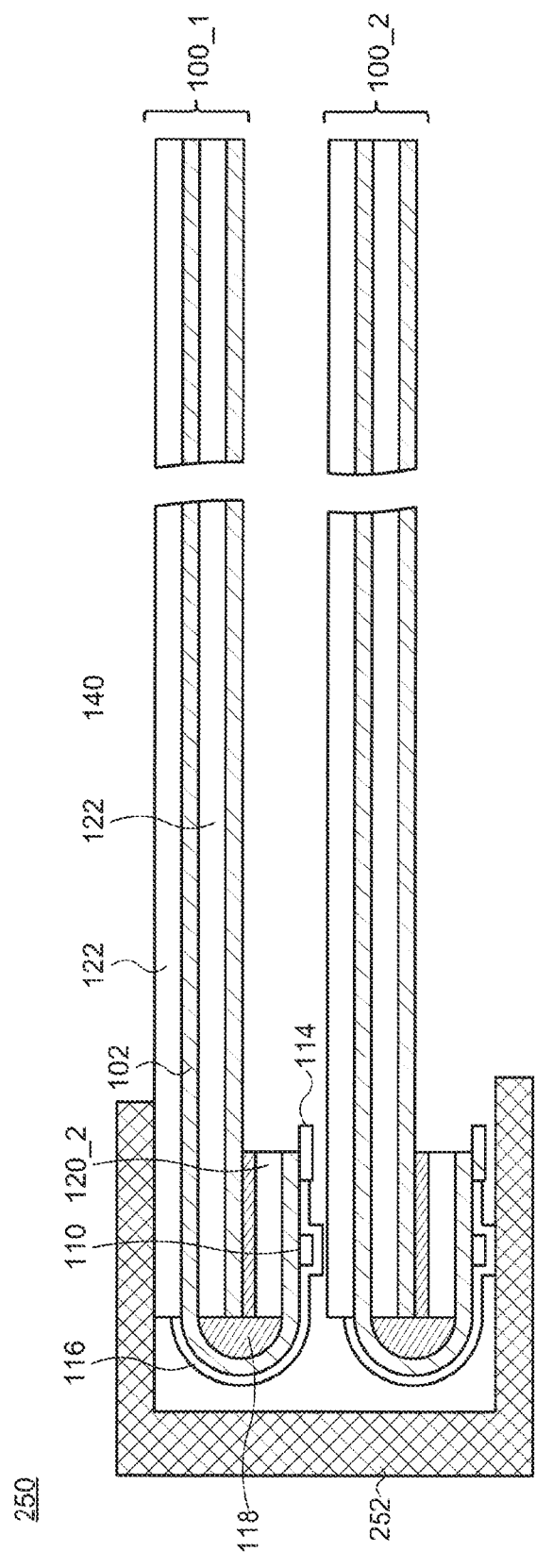

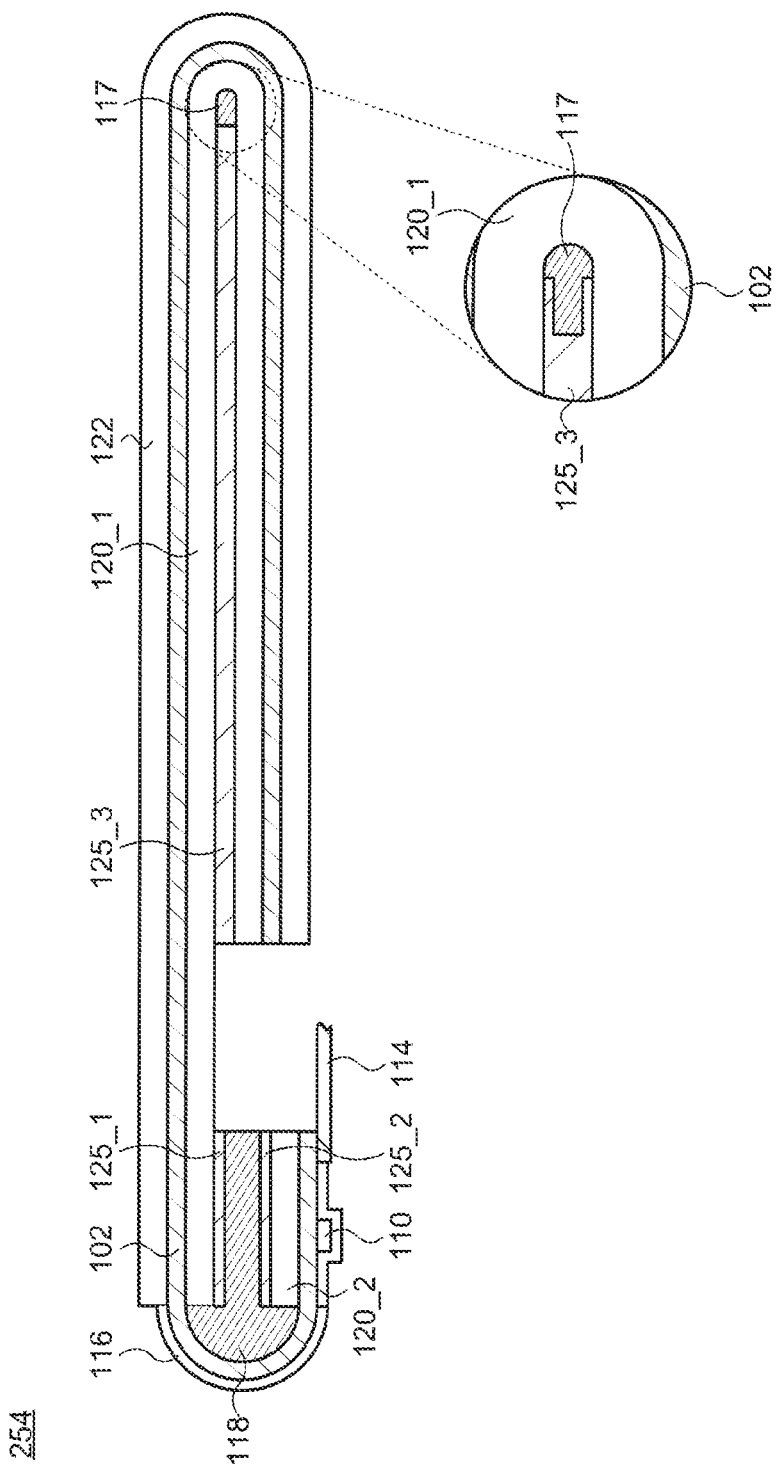

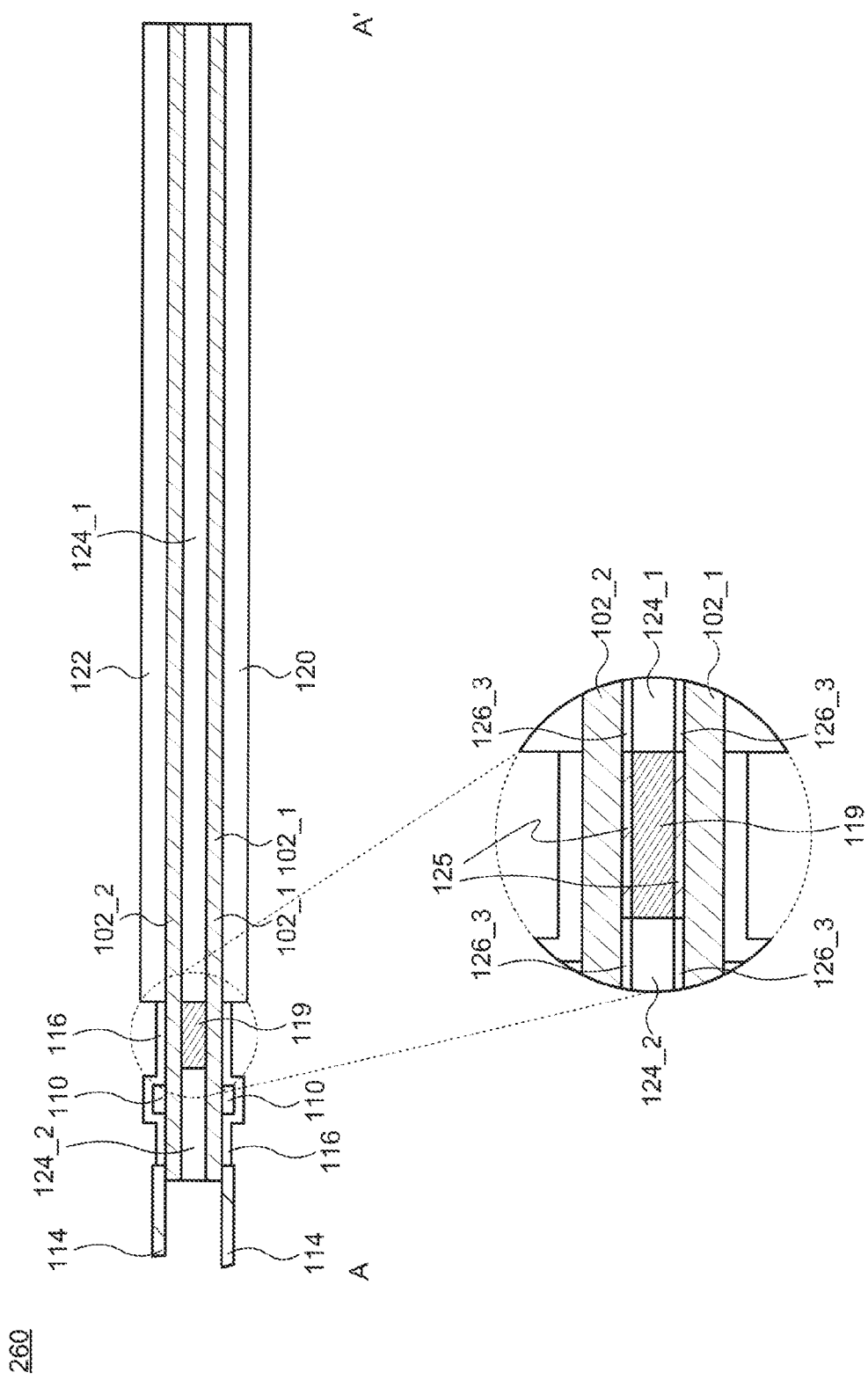

DISPLAY DEVICE AND ELECTRONIC DEVICE

CROSS REFERENCE TO RELATED APPLICATIONS

This application is based on and claims the benefit of priority from the prior Japanese Patent Application No. 2017-123035, filed on Jun. 23, 2017, the entire contents of which are incorporated herein by reference.

FIELD

The present invention relates to a display device. For example, the present invention relates to a display device having a light-emitting element in a pixel.

BACKGROUND

A liquid crystal display device and an organic EL (Electroluminescence) display device are represented as an example of a display device. A liquid crystal display device and an organic EL display device respectively have, as a display element, a liquid crystal element and an organic light-emitting element (hereinafter, referred to as a light-emitting element) in each of a plurality of pixels formed over a substrate. A liquid crystal element and a light-emitting element respectively have a layer including a compound exhibiting liquid crystallinity and a layer (electroluminescence layer) including an emissive organic compound between a pair of electrodes (cathode and anode) and are operated by applying a voltage or supplying current between the electrodes.

Use of a flexible substrate as a substrate provides flexibility to a part of or the whole of the display device, allowing the formation of a flexible display which can be freely bent or folded by a user. For example, Japanese Patent Application Publication No. 2014-95745 discloses that thermally shrinkable films exhibiting anisotropy in a shrinking direction are placed over and under a display device in order to prevent spontaneous deformation of the display device. This structure inhibits spontaneous deformation of the display device even if a temperature is changed, and the display device can be arbitrarily deformed according to the user's purpose.

SUMMARY

An embodiment of the present invention is a display device. The display device includes: an array substrate having a flexible substrate and a pixel circuit over the flexible substrate; a first supporting film under the array substrate; a second supporting film over the array substrate; and a member under the first supporting film with an adhesive layer sandwiched therebetween, the member including a first film and a second film. The first film and the second film are different in thermal expansion coefficient from each other.

An embodiment of the present invention is an electronic device. The electronic device includes a plurality of display devices and a housing. Each of the plurality of display devices possesses: an array substrate including a flexible substrate and a pixel circuit over the flexible substrate; a first supporting film under the array substrate; a second supporting film over the array substrate; a member under the first supporting film with an adhesive layer sandwiched therebetween; and a connector connected to the array substrate. The housing covers the connectors. In each of the plurality of display devices, the member has a first film and a second film over the first film, and the first film and the second film are different in thermal expansion coefficient from each other.

An embodiment of the present invention is an electronic device. The electronic device includes: a first array substrate including a first flexible substrate and a pixel circuit under the first flexible substrate; a second array substrate over the first array substrate, the second array substrate including a second flexible substrate and a pixel circuit over the second flexible substrate; a first supporting film under the first array substrate; a second supporting film over the second array substrate; and a third supporting film between the first array substrate and the second array substrate. The second supporting film is adhered to the first array substrate and the second array substrate with an adhesive layer.

BRIEF DESCRIPTION OF DRAWINGS

FIG. 2A and FIG. 2B are schematic cross-sectional views of a display device according to an embodiment;

FIG. 9A and FIG. 9B are schematic cross-sectional views of a display device according to an embodiment;

FIG. 10 is a schematic cross-sectional view of an electronic device according to an embodiment;

FIG. 11 is a schematic cross-sectional view of a display device according to an embodiment;

FIG. 12 is a schematic cross-sectional view of a display device according to an embodiment;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the present specification, when a plurality of structural elements similar to one another is discriminately indicated, the structural elements are expressed by using an underscore and a natural number behind a reference number. When all of the structural elements are indicated or an arbitrarily selected multiple thereof is expressed indiscriminately, only a reference number is used.

First Embodiment

In the present embodiment, a structure of a display device 100 according to an embodiment is explained.

1. Outline Structure

Figure 1:
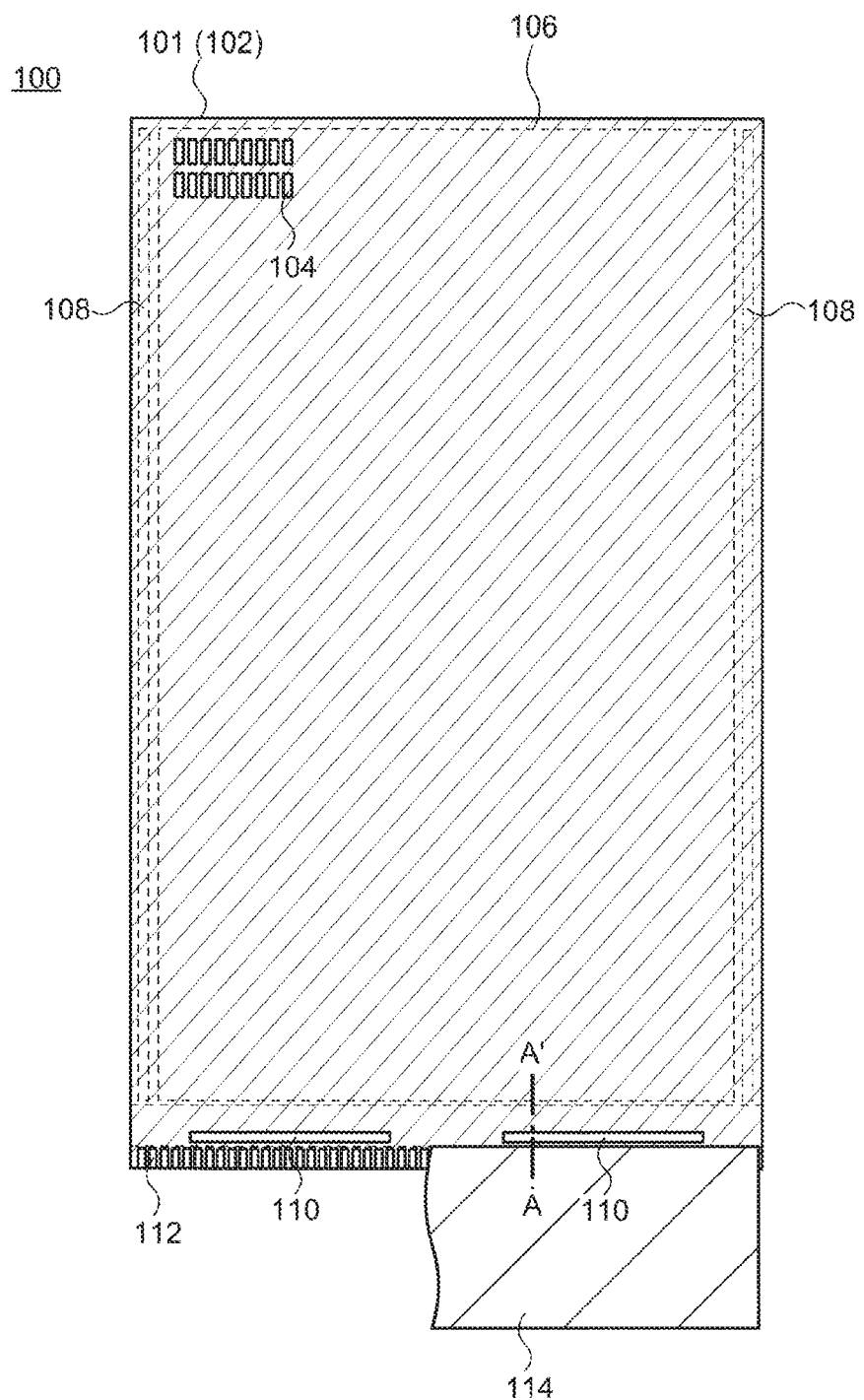
FIG. 1 is a schematic top view of a display device according to an embodiment.

A schematic top view of the display device 100 is shown in FIG. 1. The display device 100 possesses a substrate 101 over which a variety of patterned insulating films, semiconductor films, and conductive films is formed. A plurality of pixels 104 and gate-side driver circuits 108 for controlling the pixels are fabricated with these insulating films, semiconductor films, and conductive films. As described below in detail, the substrate 101 and a stack of these insulating films, semiconductor films, and conductive films are collectively referred to as an array substrate 102 in the present specification and the claims. As shown in FIG. 1, the plurality of pixels 104 is arranged in a matrix form, by which a display region 106 is defined. The gate-side driver circuits 108 are arranged in a region (peripheral region) surrounding the display region 106. In the example shown in FIG. 1, driver ICs 110 for driving the pixels 104 are further mounted over the substrate 101. Hereinafter, the present embodiment is explained by using an example in which a light-emitting element 160 is disposed in each pixel 104 as a display element.

Wirings (not illustrated) formed with patterned conductive films extend from the display region 106, the gate-side driver circuits 108, and the driver ICs 110 to a side of the substrate 101 and are exposed at an edge portion of the substrate 101 to form terminals 112. The terminals 112 are electrically connected to a connector 114 such as a flexible printed circuit (FPC) substrate. In the example shown here, the driver ICs having integrated circuits formed over semiconductor substrates are mounted over the substrate 101. However, the driver ICs 110 may be provided over the connector 114. Furthermore, a driver circuit may be additionally formed between the terminals 112 and the display region 106 by using the insulating films, the semiconductor films, and the conductive films formed over the substrate 101.

A schematic cross-sectional view along a chain line A-A' in FIG. 1 is shown in FIG. 2A. The display device 100 has a first supporting film 120 and a second supporting film 122 formed under and over the array substrate 102, respectively. These films protect the display device 100 and also provide physical strength to the display device 100. The first supporting film 120 includes a first portion 120_1 and a second portion 120_2 spaced from each other. The former overlaps with the display region 106 and the gate-side driver circuits 108, while the latter is provided so as to overlap with the terminals 112, connector 114, and the driver ICs 110. The second supporting film 122 is disposed so as to overlap with the display region 106 and the gate-side driver circuits 108. Therefore, the display region 106 and the gate-side driver circuits 108 are sandwiched by the first portion 120_1 and the second supporting film 122. A protection film 116 may be arranged over the array substrate 102 in a region between the second supporting film 122 and the connector 114. The protection film 116 includes a resin such as an epoxy resin and an acrylic resin and protects the wirings and the driver ICs 110 described above.

A soaking sheet 130 and a member 140 located under the soaking sheet 130 are provided under the first portion 120_1 of the first supporting film 120. The soaking sheet 130 has a function to disperse or release heat generated during operation of the display device 100. As described below, the member 140 is a shape-adjusting film having a function to stabilize the shape of the display device 100 and prevent spontaneous deformation of the display device 100 and is exemplified by a bimetal film. Hereinafter, the member 140 is called a bimetal film.

The substrate 101 structuring the array substrate 102 may include glass, quartz, plastics, or the like, and the use of the substrate 101 with flexibility allows the display device 100 to be utilized as a flexible display device. In this case, it is possible to fold the substrate 101 between the display region 106 and the terminals 112 (that is, between the first portion 120_1 and the second portion 120_2 of the first supporting film 120) as shown in FIG. 2B. In this state, the connector 114 and the driver ICs 110 can be arranged so as to overlap with the display region 106 and the second supporting film 122, by which an apparent size of the display device 100 can be decreased while maintaining the shape and area of the display region 106.

At that time, a spacer 118 may be provided in order to maintain the folded state. A portion of the spacer 118 is surrounded by the first portion 120_1 and the second portion 120_2 and has flat surfaces. On the other hand, another portion of the spacer 118 has a surface shape along the curved surface of the folded substrate 101. Both flat surfaces of the spacer 118 are fixed to the bimetal film 140 and the second portion 120_2 via adhesive layers 125_1 and 125_2, by which the folded state can be stably maintained.

2. Bimetal Film and Soaking Sheet

Figure 3A:
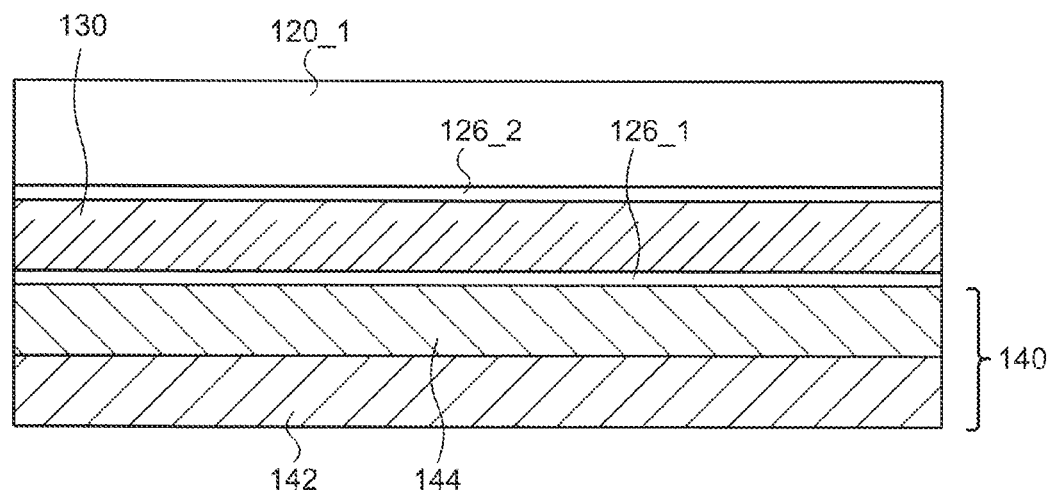
FIG. 3A and FIG. 3B are schematic cross-sectional views of a display device according to an embodiment.

A drawing in which a part of FIG. 2A is enlarged is shown in FIG. 3A. Here, the bimetal film 140, the soaking sheet 130, and the first portion 120_1 are mainly shown, but the array substrate 102 and the second portion 120_2 are not illustrated. As shown in FIG. 3A, the bimetal film 140 has a first film 142 and a second film 144 formed thereover. The first film 142 and the second film 144 each may include a single kind or plural kinds of 0 valent metals, and the metal is selected from copper, nickel, zinc, manganese, iron, cobalt, aluminum, tin, lead, silver, and the like. Hereinafter, the first film and the second film are respectively called a first metal film 142 and a second meal film 144. The first metal film 142 and the second metal film 144 include different metals from each other or have compositions or composition rates different from each other. Therefore, the first metal film 142 and the second metal film 144 have a different thermal expansion coefficient respectively, and the bimetal film 140 in an isolated state spontaneously deforms with a change in temperature.

The first metal film 142 and the second metal film 144 are bonded to each other. For example, these films are bonded with cold pressure welding, diffusion bonding, ultrasonic bonding, friction welding, or the like. Therefore, an adhesive layer may not be provided therebetween.

Figure 4A:
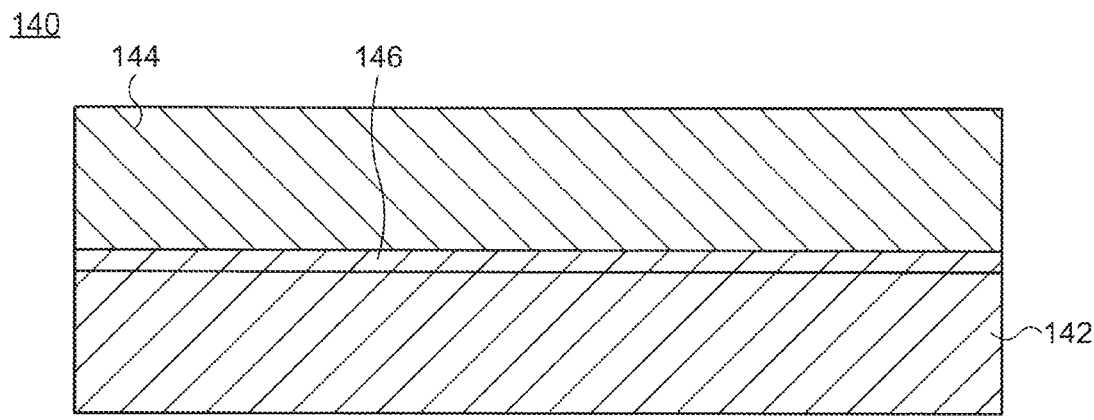
FIG. 4A to FIG. 4C are schematic cross-sectional views of a display device according to an embodiment.

As shown in FIG. 4A, the bimetal film 140 may further include an alloy containing the metal (first metal $M_1$) included in the first metal film 142 and the metal (second metal $M_2$) included in the second metal film 144 or an intermediate layer 146 containing an intermetallic compound of the first metal $M_1$ and the second metal $M_2$ at an interface of the first metal film 142 and the second metal film 144. Here, an alloy and an intermetallic compound are distinguished in the present specification and the claims. An intermetallic compound is a compound which includes the first metal $M_1$ and the second metal $M_2$ at an integer ratio or a substantially integral ratio. An alloy is a compound other than an intermetallic compound and contains the first metal $M_1$ and the second metal $M_2$.

Figure 4B:
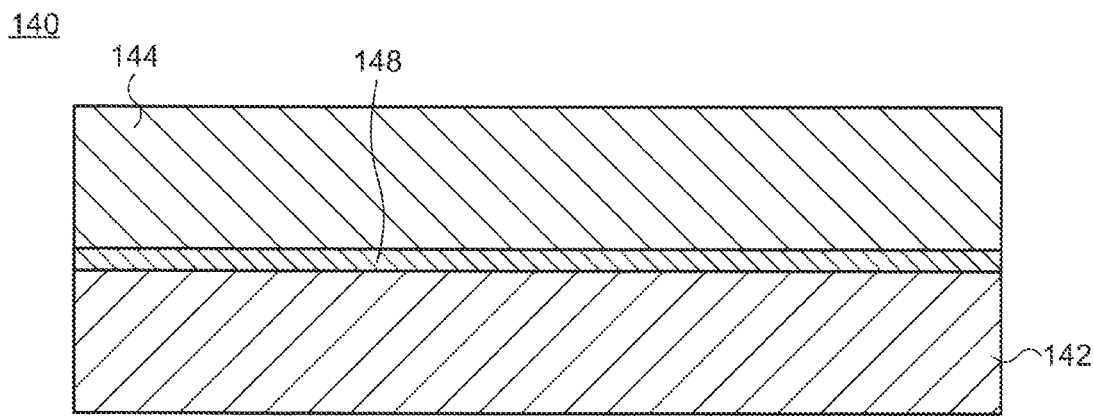

Alternatively, the bimetal film 140 may include an oxide layer 148 containing one or both of oxides of the first metal $M_1$ and the second metal $M_2$ at the interface of the first metal film 142 and the second metal film 144 as shown in FIG. 4B.

Figure 4C:
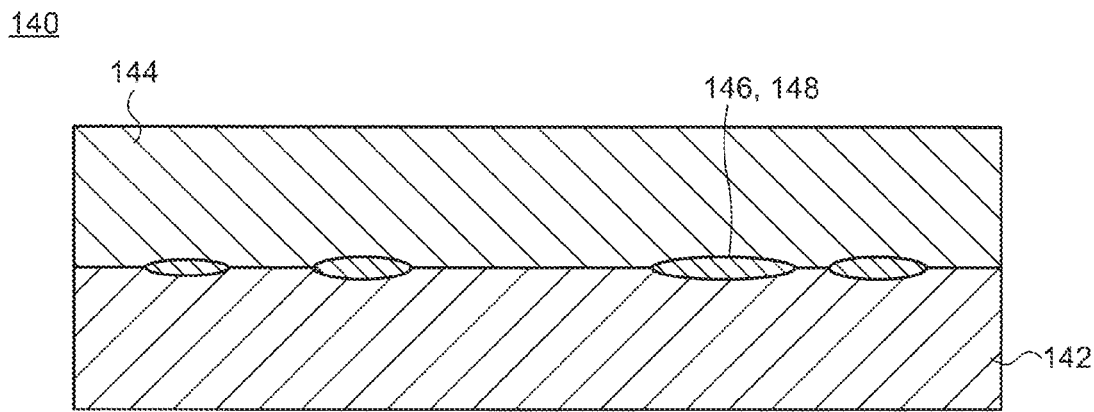

The intermediate layer 146 and the oxide layer 148 may be formed continuously at the interface of the first metal film 142 and the second metal film 144 as shown in FIG. 4A and FIG. 4B or may be discontinuous as shown in FIG. 4C. In the case where the intermediate layer 146 and the oxide layer 148 are discontinuous, these layers exist in an island form at the interface, and the first metal film 142 and the second metal film 144 are in direct contact with each other in a region where the intermediate layer 146 and the oxide layer 148 do not exist.

The soaking sheet 130 is also a metal film and includes a metal having high thermal conductivity, such as aluminum, copper, and iron, or an alloy thereof. The soaking sheet 130 may have a single layer structure or a stacked-layer structure. The soaking sheet 130 is adhered to the bimetal film 140 with an adhesive layer 126_1 (see FIG. 3A). Similarly, the soaking sheet 130 and the first portion 120_1 of the first supporting film 120 are adhered with an adhesive layer 126_2. The adhesive layers 126_1 and 126_2 may be formed by using an adhesive including a polymer compound such as an acrylic-based, epoxy-based, or acrylate-based adhesive.

Figure 3B:
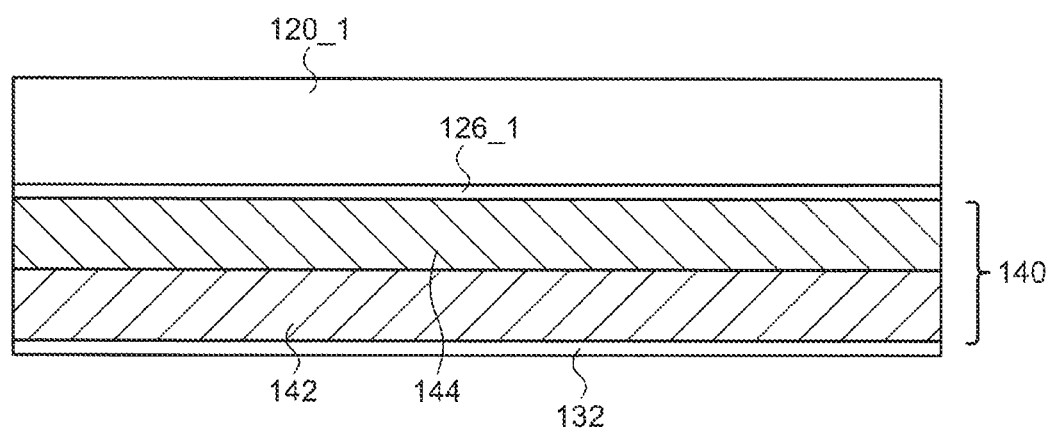

Note that it is not always necessary to provide the soaking sheet 130 in the display device 100. In this case, the bimetal film 140 also has the function of the soaking sheet 130 and is adhered to the first portion 120_1 with the adhesive layer 126_1 without the soaking sheet 130 as shown in FIG. 3B. Furthermore, a protection film 132 for protecting the bimetal film 140 may be disposed, as an optional structure, under the bimetal film 140. The protection film 132 may include an organic compound such as a polymer material or an inorganic compound such as silicon nitride and silicon oxide.

3. Structure of Pixel

The pixel circuit including the light-emitting element 160 is formed in each pixel 104 with a variety of patterned insulating films, semiconductor films, and conductive films. The structure of the pixel circuit may be arbitrarily selected, and an example is shown as an equivalent circuit in FIG. 5.

Figure 5:
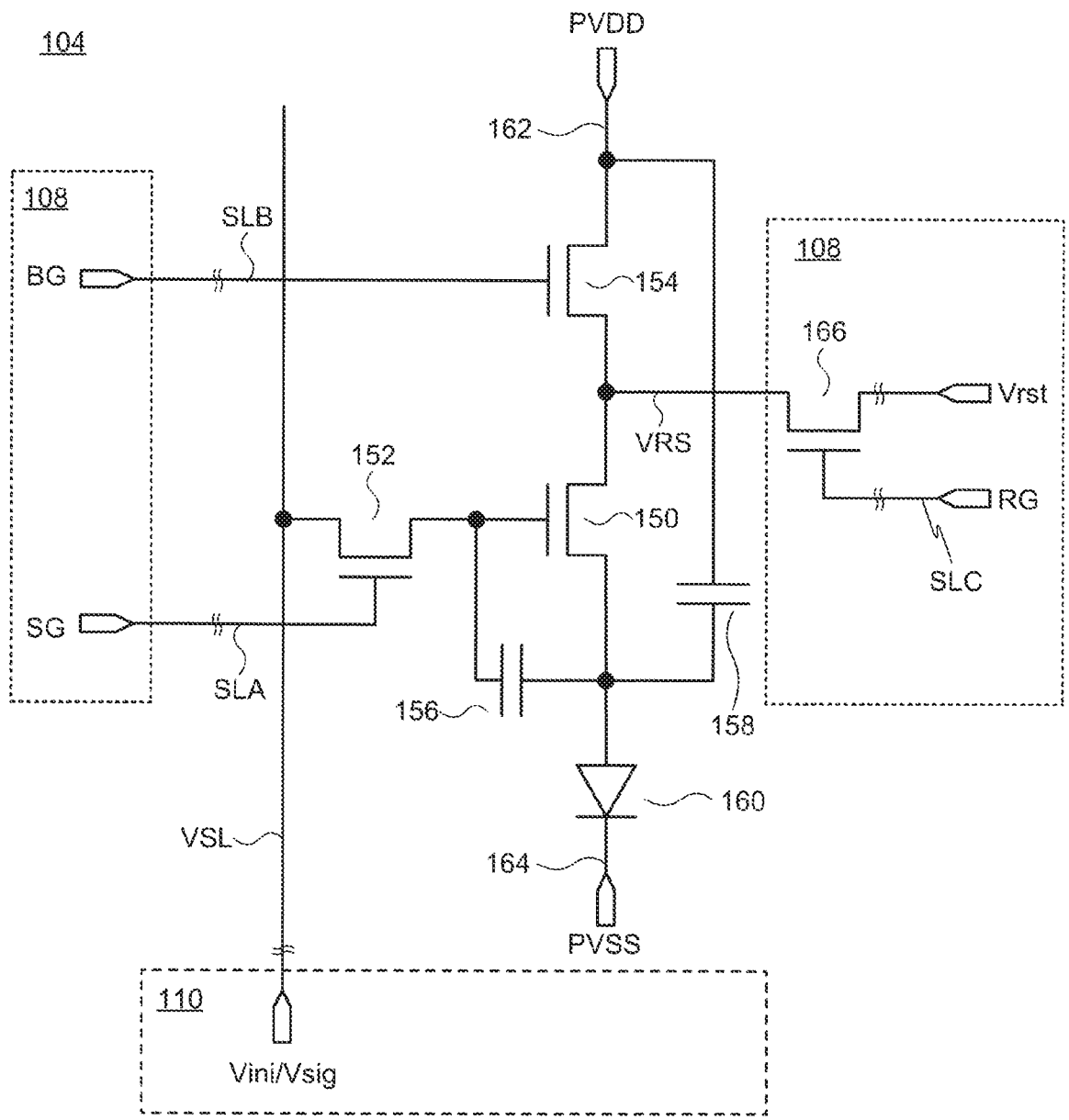
FIG. 5 is an example of an equivalent circuit of a pixel of a display device according to an embodiment.

The pixel circuit shown in FIG. 5 includes a driving transistor 150, a first switching transistor 152, a second switching transistor 154, a storage capacitor 156, and a supplementary capacitor 158 in addition to the light-emitting element 160. The light-emitting element 160, the driving transistor 150, and the second switching transistor 154 are connected in series between a high-potential power-source line 162 and a low-potential power-source line 164. The high-potential power-source line 162 is provided with a high potential PVDD, and the low-potential power-source line 164 is provided with a low potential PVSS lower than the high potential PVDD.

The driving transistor 150 has a gate as a control terminal and a source and drain as input-output terminals. In the present embodiment, the driving transistor 150 is regarded as a n-channel type transistor, the input-output terminal electrically connected to the high-potential power-source line 162 is regarded as a drain, and the input-output terminal electrically connected to the light-emitting element 160 is regarded as a source. The drain of the driving transistor 150 is electrically connected to the high-potential power-source line 162 via the second switching transistor 154, and the source is electrically connected to a pixel electrode 200 of the light-emitting element 160.

The gate of the driving transistor 150 is electrically connected to a first signal line VSL via the first switching transistor 152. Operation (on/off) of the first switching transistor 152 is controlled with a scanning signal SG supplied to a first scanning signal line SLA connected to the gate thereof. When the first switching transistor 152 is on, a potential of the first signal line VSL is provided to the gate of the driving transistor 150. An initialization signal Vini and an image signal Vsig are supplied to the first signal line VSL at a predetermined timing. The initialization signal Vini is a signal providing an initialization potential having a constant level. The first switching transistor 152 synchronizes with the first signal line VSL, and on/off is controlled at a predetermined timing to give the gate of the driving transistor 150 a potential based on the initialization signal Vini or the image signal Vsig.

A second signal line VRS is electrically connected to the drain of the driving transistor 150. The second signal line VRS is supplied with a reset potential Vrst via a reset transistor 166. A timing of the reset signal Vrst supplied through the reset transistor 166 is controlled by a reset signal RG supplied to a third signal line SLC.

The storage capacitor 156 is arranged between the source and the gate of the driving transistor 150. One terminal of the supplementary capacitor 158 is connected to the source of the driving transistor 150, and the other terminal is connected to the high-potential power-source line 162. The supplementary capacitor 158 may be arranged so that the other terminal is connected to the low-potential power-source line 164. The storage capacitor 156 and the supplementary capacitor 158 are provided in order to secure a gate-source voltage Vgs corresponding to the image signal Vsig when the image signal Vsig is supplied to the gate of the driving transistor 150.

The driver ICs 110 output the initialization signal Vini or the image signal Vsig to the first signal line VSL. The gate-side driver circuits 108 output the scanning signal SG, the scanning signal BG, and the reset signal RG to the first scanning line SLA, the second scanning signal line SLB, and the third signal line SLC, respectively.

4. Array Substrate

Figure 6:
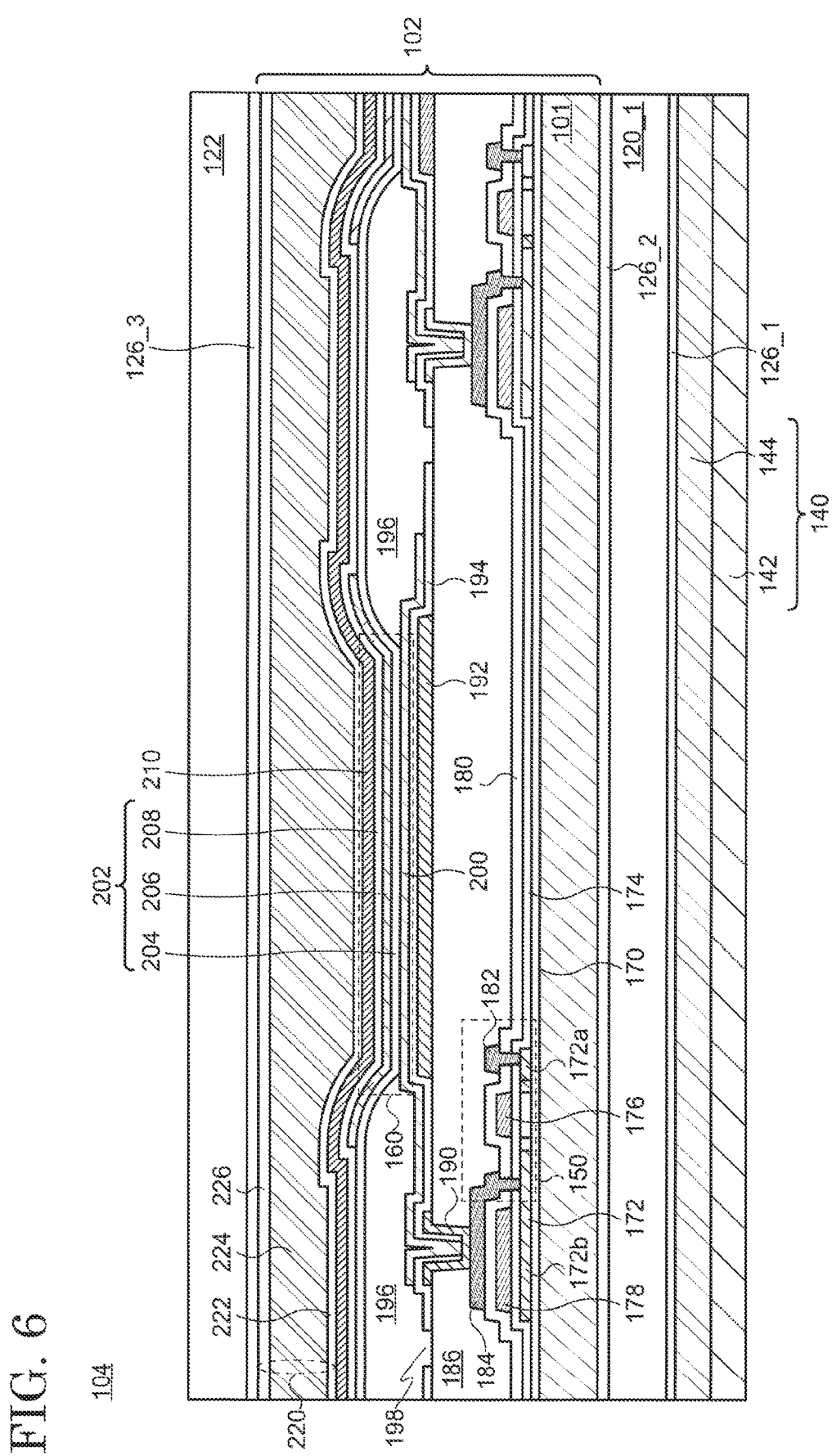
FIG. 6 is a schematic cross-sectional view of a display device according to an embodiment.

The structure of the array substrate 102 is explained by using a cross-sectional structure of the pixel 104. FIG. 6 is a drawing schematically showing an example of the cross-sectional structure of the display device 100 which does not include the soaking sheet 130, and the cross-sectional structure of the driving transistors 150, the storage capacitors 156, the supplementary capacitors 158, and the light-emitting elements 160 in the pixel circuits of the adjacent two pixels 104 is illustrated. As described above, the bimetal film 140 has the first metal film 142 and the second metal film 144 bonded to each other and is adhered to the first portion 120_1 of the first supporting film 120 with the adhesive layer 126_1. The first portion 120_1 is also adhered to the substrate 101 with the adhesive layer 126_2.

Each element in the pixel circuit is provided over the substrate 101 through an undercoat 170. The driving transistor 150 includes a semiconductor film 172, a gate insulating film 174, a gate electrode 176, a drain electrode 182, and a source electrode 184. The gate insulating film 174 is formed to cover the semiconductor film 172. The gate electrode 176 is arranged so as to intersect at least a part of the semiconductor film 172 with the gate insulating film 174 therebetween, and a channel is formed in a region overlapping with the gate electrode 176. The semiconductor film 172 further possesses a drain region 172a and a source region 172b sandwiching the channel.

A capacitor electrode 178 existing in the same layer as the gate electrode 176 is disposed so as to overlap with the source region 172b through the gate insulating film 174. An interlayer insulating film 180 is formed over the gate electrode 176 and the capacitor electrode 178. Openings reaching the drain region 172a and the source region 172b are formed in the interlayer insulating film 180 and the gate insulating film 174, and the drain electrode 182 and the source electrode 184 are arranged so as to cover the openings. A part of the source electrode 184 overlaps with a part of the source region 172b with the interlayer insulating film 180 therebetween, and the storage capacitor 156 is formed by the part of the source region 172b, the gate insulating film 174, the capacitor electrode 178, the interlayer insulating film 180, and the part of the source electrode 184.

A leveling film 186 is further provided over the driving transistor 150 and the storage capacitor 156. An opening reaching the source electrode 184 is formed in the leveling film 186, and a connection electrode 190 covering this opening and a part of a top surface of the leveling film 186 is disposed so as to be in contact with the source electrode 184. A supplementary capacitor electrode 192 is further arranged over the leveling film 186. The connection electrode 190 and the supplementary capacitor electrode 192 may exist in the same layer. An insulating film 194 is formed so as to cover the connection electrode 190 and the supplementary capacitor electrode 192. The insulating film 194 does not cover a part of the connection electrode 190 in the opening formed in the leveling film 186 to expose an upper surface of the connection electrode 190. This structure enables the electrical connection between the pixel electrode 200 formed over the connection electrode 190 and the source electrode 184 through the connection electrode 190. An opening 198 may be formed in the insulating film 194 to allow contact between a partition wall 196 formed thereover and the leveling film 186. Impurities in the leveling film 186 can be removed through the opening 198, thereby increasing reliability of the pixel circuit and the light-emitting element 160. Note that the connection electrode 190 and the opening 198 may be arbitrarily formed.

The pixel electrode 200 of the light-emitting element 160 is provided over the insulating film 194 so as to cover the connection electrode 190 and the supplementary capacitor electrode 192. The insulating film 194 is sandwiched by the supplementary electrode 192 and the pixel electrode 200, and this structure constructs the supplementary capacitor 158. The pixel electrode 200 is shared by the supplementary capacitor 158 and the light-emitting element 160.

The partition wall 196 covering an edge portion of the pixel electrode 200 is formed over the pixel electrode 200. An electroluminescence layer (hereinafter, referred to as an EL layer) 202 and an opposing electrode 210 thereover are provided so as to cover the pixel electrode 200 and the partition wall 196. The light-emitting element 160 is formed by the pixel electrode 200, the EL layer 202, and the opposing electrode 210. In the present specification and the claims, the EL layer 200 means all of the layers provided between the pixel electrode 200 and the opposing electrode 210.

The EL layer 202 may be composed of a plurality of layers and is formed by appropriately combining a variety of functional layers such as a carrier-injection layer, a carrier-transporting layer, an emission layer, a carrier-blocking layer, and an exciton-blocking layer, for example. The structure of the EL layer 202 may be the same between all of the pixels 104, or the EL layer 202 may be formed so that the structure thereof is different between the adjacent pixels 104. For example, the EL layer 202 is formed so that the structure or the material of the emission layer is different between the adjacent pixels 104, by which light-emissions with different colors can be obtained from the adjacent pixels 104. When the same EL layer 202 is used in all of the pixels 104, a plurality of emission colors is attainable by providing a color filter. In FIG. 6, a hole-transporting layer 204, an emission layer 206, and an electron-transporting layer 208 are shown as typical functional layers.

A protection film (hereinafter, referred to as a passivation film) 220 may be disposed, as an optional structure, over the light-emitting element 160. The structure of the passivation film 220 can be arbitrarily selected, and a stacked structure including a first layer 222 containing an inorganic compound, a second layer 224 containing an organic compound, and a third layer 226 containing an inorganic compound may be employed as shown in FIG. 6.

The second supporting film 122 is adhered to the passivation film 220 with an adhesive layer 126_3. Although not shown, a touch sensor, a polarizing plate, or the like may be disposed over the passivation film 220 or the second supporting film 122.

The aforementioned undercoat 170, the gate insulating film 174, the interlayer insulating film 180, the insulating film 194, the first layer 222, and the third layer 226 may contain an inorganic compound. An inorganic compound containing silicon, such as silicon oxide and silicon nitride, can be used as an inorganic compound. On the other hand, the leveling film 186, the partition wall 196, the adhesive layers 126, and the second layer 224 include an organic compound. An organic compound may include a polymer such as an epoxy resin, an acrylic resin, an acrylate resin, a polyimide, a polyamide, or a polysiloxane. These polymers may have a linear chain structure or may be intermolecularly crosslinked. The semiconductor film 172 may include a Group 14 element such as silicon and germanium or an oxide semiconductor containing a Group 13 element such as indium and gallium or a Group 12 element such as zinc. The gate electrode 176, the capacitor electrode 178, the connection electrode 190, the supplementary capacitor electrode 192, and the opposing electrode 210 may include a metal such as aluminum, copper, titanium, molybdenum, tungsten, and tantalum, an alloy thereof, or a conductive oxide such as indium-tin oxide (ITO) and indium-zinc oxide (IZO).

In the present specification and the claims, the array substrate 102 means the substrate 101 and a variety of layers formed thereover from which the second supporting film 122 and the adhesive layer 126_3 for adhering the second supporting film 122 are excluded. Therefore, in the structure shown in FIG. 6, the array substrate 102 includes the substrate 101 to the passivation film 220. When a touch sensor is formed between the passivation film 220 and the second supporting film 122, the array substrate 102 includes the substrate 101 to the touch sensor.

5. Stabilization of Shape

Figure 7A:
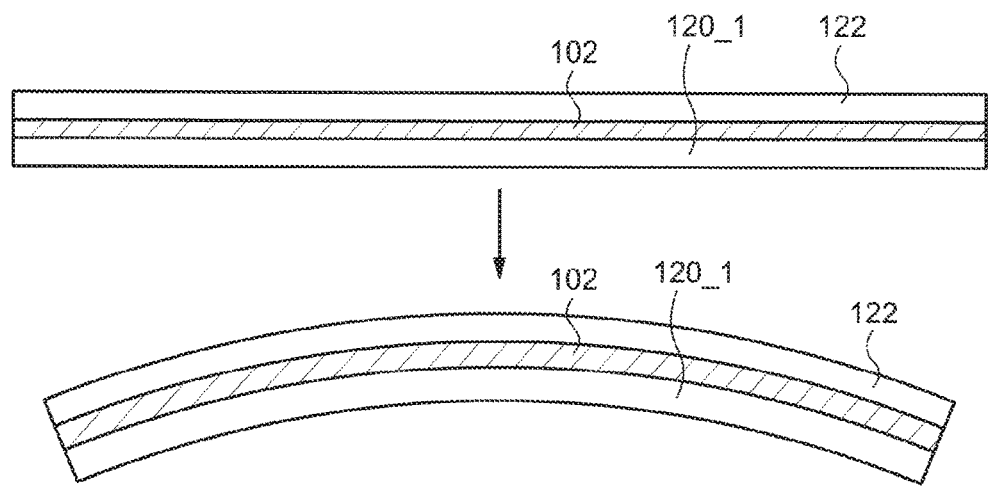
FIG. 7A and FIG. 7B are drawings for explaining stabilization of a shape of a display device according to an embodiment.

As described above, the array substrate 102 is structured by a stack of a variety of insulating films, conductive films, and semiconductor films. Therefore, internal stress is generated in the array substrate 102 due to the difference in thermal expansion coefficient of materials, which leads to deformation of the array substrate 102 with a change in temperature. For example, even though the array substrate 102 has a substantially flat surface at a certain temperature, the array substrate 102 bends with increasing or decreasing temperature so that the first supporting film 120 is located inside with respect to the second supporting film 122 as shown in a schematic cross-sectional view in FIG. 7A. Alternatively, although not illustrated, the array substrate 102 bends with increasing or decreasing temperature so that the first supporting film 120 is located outside with respect to the second supporting film 122. When the array substrate 102 deforms with a change in temperature, the display device 100 spontaneously deforms into a shape which is not intended by a user. As a result, handleability of the display device 100 is decreased.

Figure 7B:
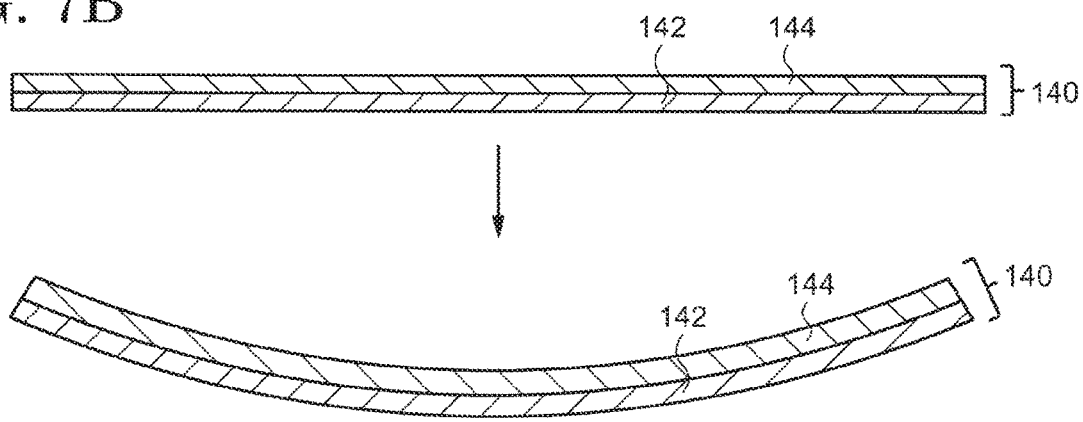

The structure of the bimetal film 140 is adjusted so that the deformation of the array substrate 102 is canceled in order to avoid such spontaneous deformation. That is, in a case where a stack (hereinafter, simply referred to as a stacked body) including the array substrate 102, the first supporting film 120, and the second supporting film 122 deforms with a temperature change so that the first supporting film 120 is located inside with respect to the second supporting film 122 (FIG. 7A and FIG. 7B), the bimetal film 140 is configured to be deformed with this temperature change so that the second metal film 144 is located inside with respect to the first metal film 142. On the other hand, in a case where the stacked body deforms with a temperature change so that the first supporting film 120 is located outside the second supporting film 122, the bimetal film 140 is configured to be deformed with this temperature change so that the second metal film 144 is located outside the first metal film 142.

Figure 8:
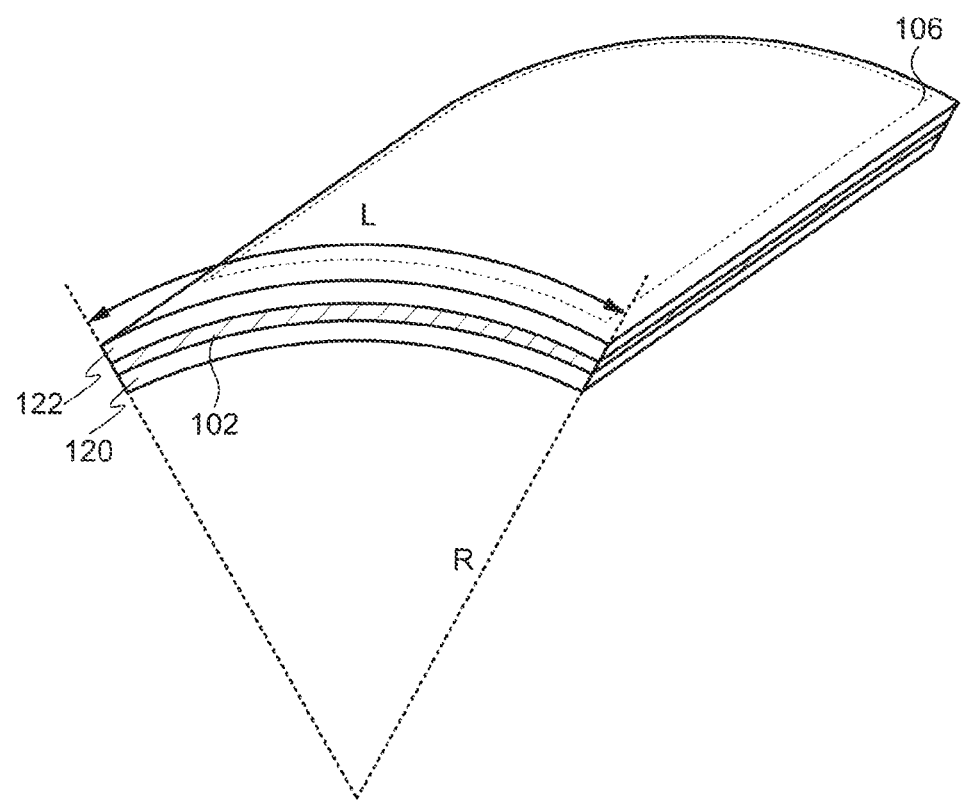
FIG. 8 is a drawing for explaining stabilization of a shape of a display device according to an embodiment.

More specifically, a curvature radius R of the stacked body is first measured when a temperature is changed from $T_1$ to $T_2$ where $T_1$ is a temperature at which the stacked body exists in a plane shape (see FIG. 8). Then the materials and the structures of the first metal film 142 and the second metal film 144 are adjusted so that the following equation is satisfied:

$$\frac{1}{R} = \frac{(\alpha_1 - \alpha_2)\Delta T}{h} \times \frac{12E_1E_2}{(E_1 + E_2)^2 + 12E_1E_2}$$

where $\Delta T$ is a difference $(T_2-T_1)$ between $T_2$ and $T_1$, $\alpha_1$ and $\alpha_2$ are respectively the thermal expansion coefficients of the first metal film 142 and the second metal film 144, $E_1$ and $E_2$ are respectively the Young's moduli of the first metal film 142 and the second metal film 144, and h is a total thickness of the first metal film 142 and the second metal film 144.

This configuration counterbalances the deformation of the stacked body and the bimetal film 140, by which a display device which does not spontaneously deform with a temperature change originating from the external environment or resulting from heat generated by the display device. Implementation of the present embodiment allows production of a display device which can be arbitrarily deformed by a user regardless of the external environment.

In the present embodiment, the shape stabilization of a display device is demonstrated for a case where the bimetal film 140 having two metal films is used as a shape-adjusting film. However, the number of the metal films included in the shape-adjusting film is not limited, and three or more metal films may be included. Additionally, a film included in the shape-adjusting film is not limited to a metal film, and the shape-adjusting film may be formed by stacking a metal film and an insulating film so that the thermal expansion coefficients, the Young's moduli, and the total thickness thereof satisfy the aforementioned equation.

Second Embodiment

In the present embodiment, a structure of an electronic device 250 having a plurality of display devices 100 is explained.

As shown in FIG. 9A, the electronic device 250 possesses the plurality of display devices 100 each connected to the connector 114. The plurality of display devices 100 is arranged so that the display regions 106, the periphery regions, and the connectors 114 overlap with each other. The electronic device 250 further includes a housing 252 covering the connectors 114 and the second portions 120_2. A part of the housing 252 may cover and be in contact with the second supporting film 122 of one display device 100_1 and the bimetal film 140 of the other display device 100_2. In the example show in FIG. 9A, the stacking order of the first supporting film 120, the array substrate 102, and the second supporting film 122 is the same between the plurality of display devices 100. However, this stacking order may be different between the display devices 100.

The number of the display devices 100 included in the electronic device 250 is not limited, and three or more display devices 100 may be provided. For example, as shown in FIG. 9B, the electronic device 250 may have n display devices 100 (n is a natural number equal to or larger than 2). Although not illustrated, the bimetal film 140 and the second supporting film 122 may be in direct contact with each other or may be adjacent to each other through the protection film 132 between the adjacent display devices 100.

The array substrates 102 may be folded between the first portion 120_1 and the second portion 120_2 of the first supporting film 120 in the housing 252. Specifically, the electronic device 250 may have the plurality of display devices 100 in a state where the array substrate 102 is folded so that the second portion 120_2 overlaps with the first portion 120_1 as shown in FIG. 10. Note that the adhesive layer 125_1 and the adhesive layer 125_2 are not illustrated for visibility in FIG. 10 (see FIG. 2A and FIG. 2B).

As described in the First Embodiment, the display device 100 is provided with the bimetal film 140 for preventing deformation of the stacked body including the array substrate 102 caused by a temperature change. Therefore, since each display device does not spontaneously deform, the electronic device 250 does not spontaneously deform according to the external environment or self-heating. Hence, implementation of the present embodiment allows the electronic device 250 to be provided with a shape intended by a user regardless of a temperature change, and an electronic device with excellent handleability can be produced.

Third Embodiment

In the present embodiment, a display device 254 different in structure from the display device 100 is explained. An explanation of the structure the same as or similar to that of the display device 100 may be omitted.

A cross-sectional view of the display device 254 is shown in FIG. 11. The display device 254 is different from the display device 100 in that the bimetal film 140 is not disposed, the array substrate 102 is folded in the display region 106, and the first portion 120_1 of the first supporting film 120 is adhered to another first portion 120_1 with the adhesive layer 125_3 in a region where the display region 106 overlaps with anther region 106. The light-emission from the light-emitting element 160 disposed in each pixel 104 is extracted through the second supporting film 122. Therefore, the display device 254 is able to provide an image not only on the surfaces of both sides (upper side and lower side of the display device 245 in FIG. 11) but also on a side surface.

At one edge portion of the display device 254, the spacer 118 is arranged between the first portion 120_1 and the second portion 120_2 and adhered to the first portion 120_1 and the second portion 120_2 through the adhesive layer 125_1 and 125_2, respectively. On the other hand, at the other edge portion of the display device 254, a spacer 117 is disposed. The stereostructure of the folded portion of the display region 106 is stabilized by the spacer 117, by which deformation of the array substrate 102 in the folded portion can be prevented. As illustrated in an enlarged view of FIG. 11, a part of the spacer 117 is in contact with the first portion 120_1, and another part is adhered to the first portion 120_1 through the adhesive layer 125_3. Although not illustrated, the soaking sheet 130 may be provide between the first supporting film 120 and the adhesive layer 125_3, similar to the First Embodiment.

Similar to the stacked body of the display device 100, internal stress exists in the array substrate 102, which results in spontaneous deformation of the array substrate 102 with a temperature change. However, the force which deforms the array substrate 102 is counterbalanced even if the bimetal film 140 is not provided because the display device 254 having the structure described above has a symmetrical structure in the display region 106 with respect to the adhesive layer 125_3 as a symmetry plane. As a result, the spontaneous deformation of the display device 254 with a temperature change is suppressed. Hence, implementation of the present embodiment allows the display device 254 to be provided with a shape intended by a user regardless of a temperature change, and a display device with excellent handleability can be produced at a low cost. Note that, at the outer side surface of the display device 254 corresponding to the spacer 117, a mode may be employed in which the protection film 116 is provided instead of the second supporting film 122. In this case, the plane on which the pixel circuits including the light-emitting elements 160 are formed serves as a neutral plane when the side surface is bent, and the stress caused by the bending is not applied to the pixel circuit, by which reliability is improved.

Fourth Embodiment

In the present embodiment, a display device 260 different in structure from the display device 100 is explained. An explanation of the structure the same as or similar to that of the display device 100 may be omitted.

A schematic cross-sectional view of the display device 260 is shown in FIG. 12. This cross-sectional view is taken along the chain line A-A' in FIG. 1 and corresponds to FIG. 2A. The display device 260 does not possess the bimetal film 140 but is different from the display device 100 in possessing two array substrates 102_1 and 102_2. That is, the display device 260 has the first supporting film 120, a first array substrate 102_1 over the first supporting film 120, a second array substrate 102_2 over the first array substrate 102_1, the second supporting film 122 over the second array substrate 102_2, and a third supporting film 124 between the first array substrate 102_1 and the second array substrate 102_2.

The third supporting film 124 possesses a first portion 124_1 and a second portion 124_2. The former overlaps with the display regions 106 and the gate-side driver circuits 108 of the first array substrate 102_1 and the second array substrate 102_2, and the latter is disposed so as to overlap with the terminals 112, the connectors 114, and the driver ICs 110. The first portion 124_1 and the second portion 124_2 are fixed to the first array substrate 102_1 and the second array substrate 102_2 through the adhesive layer 126_3.

Furthermore, a spacer 119 sandwiched by the first array substrate 102_1 and the second array substrate 102_2 may be further provided in a region between the first portion 124_1 and the second portion 124_2. As shown in an enlarged figure of FIG. 12, unlike the spacer 118 of the display device 100, it is not necessary for the spacer 119 to have a curved shape, and the spacer 119 has flat surfaces opposing each other. These surfaces are fixed to the first array substrate 102_1 and the second array substrate 102_2 with the adhesive layer 125.

The pixel circuit is provided over the substrate 101 in the first array substrate 102_1, and the pixel circuit is arranged under the substrate 101 in the second array substrate 102_2. The display regions 106 of the first array substrate 102_1 and the second array substrate 102_2 are arranged so as to overlap with each other. Therefore, the first array substrate 102_1 displays an image on the display device 260, while the second array substrate 102_2 displays an image under the display device 260. In other words, the display device 260 is able to display an image on both surfaces.

Figure 13:
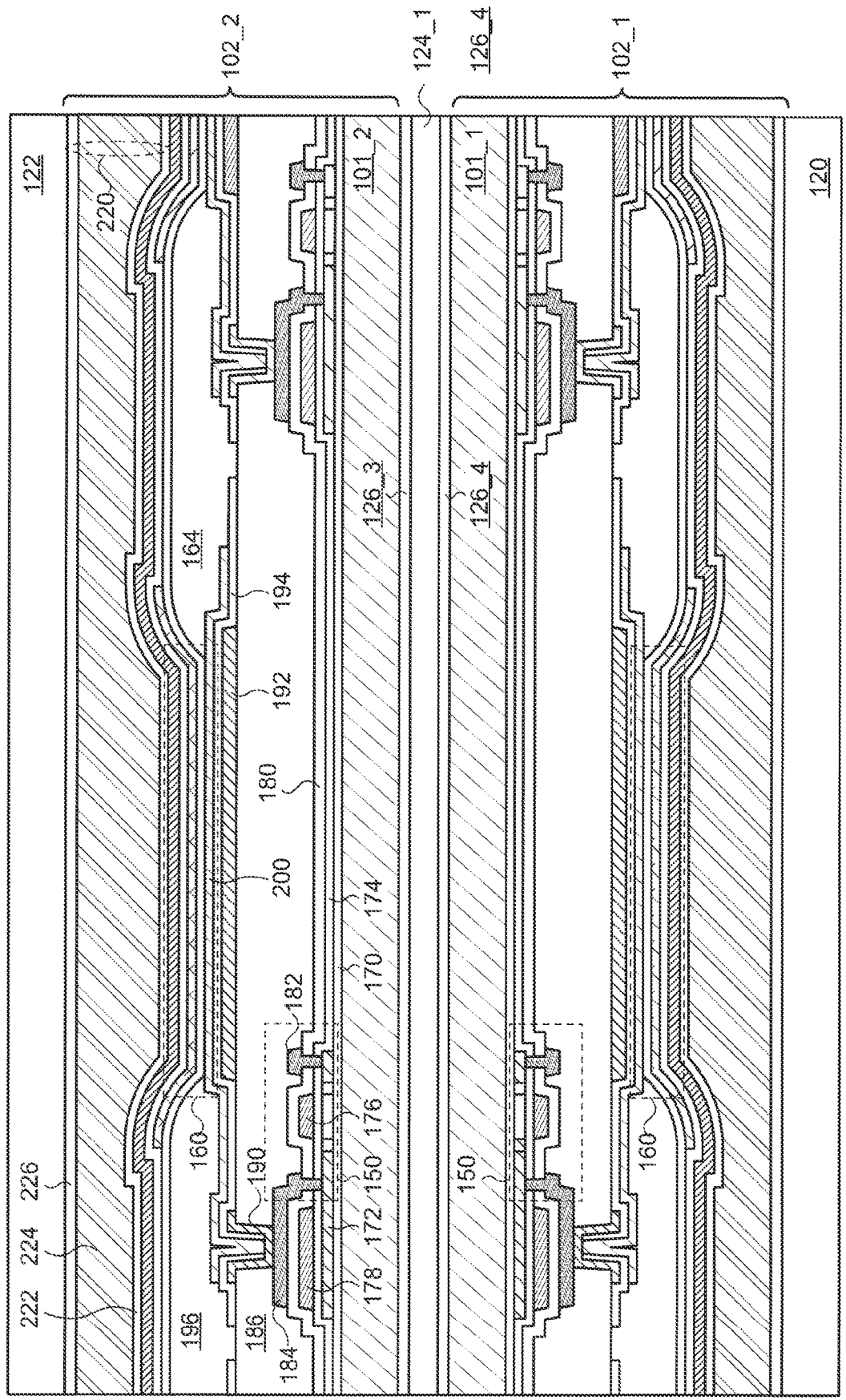
FIG. 13 is a schematic cross-sectional view of a display device according to an embodiment.

A detailed structure of the display device 260 is shown in FIG. 13 by using a cross-sectional view. FIG. 13 shows the driving transistors 150, the storage capacitors 156, the supplementary capacitors 158, and the light-emitting elements 160 of the pixel circuits of the adjacent pixels 104. The first array substrate 102_1 and the second array substrate 102_2 may have the same or similar structure as that of the array substrate 102 of the display device 100. The substrate 101_1 of the first array substrate 102_1 is adhered to the third supporting film 124 with an adhesive layer 126_4. Similarly, the substrate 101_2 of the second array substrate 102_2 is adhered to the third supporting film 124 with the adhesive layer 126_3. Therefore, the display device 260 has a symmetrical structure with the supporting film 124 as a symmetrical plane.

Figure 14:
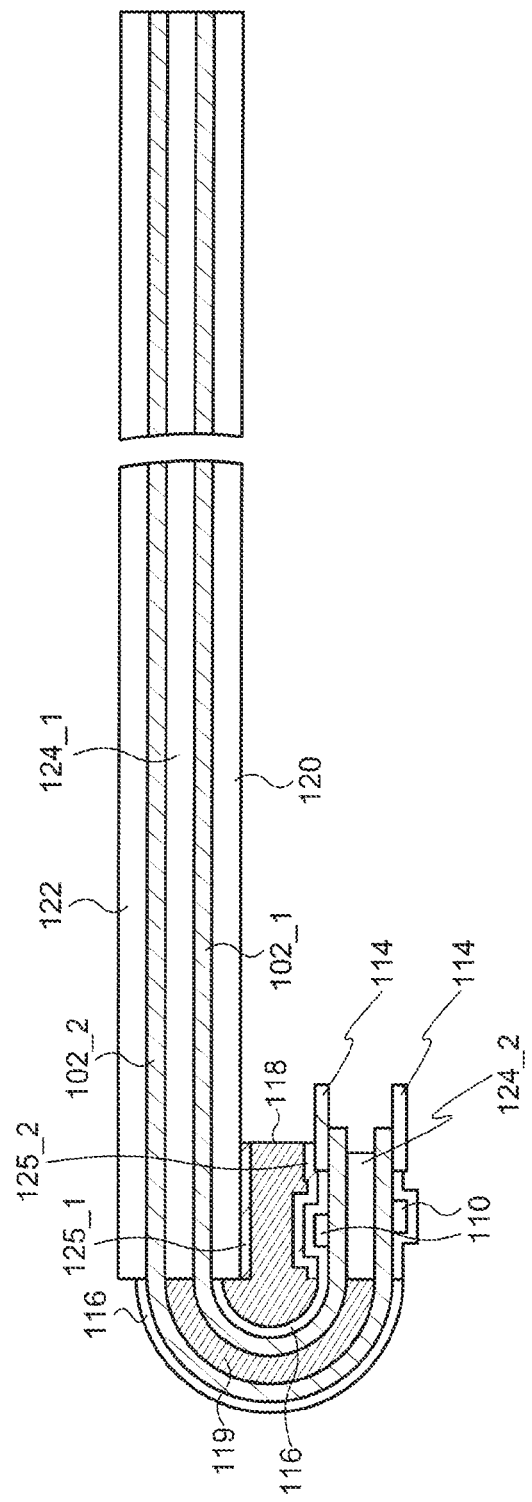
FIG. 14 is a schematic cross-sectional view of a display device according to an embodiment.

Similar to the display device 100, the first array substrate 102_1 and the second array substrate 102_2 can be folded in a region between the first portion 124_1 and the second portion 124_2 of the third supporting film 124 in the display device 260 as shown in FIG. 14. In this case, the second portion 124_2 overlaps with the first portion 124_1. Similar to the case of the display device 100, the spacer 118 may be disposed in order to maintain the folded shape. The spacer is sandwiched between the first supporting film 120 and the second portion 124_2 and fixed to the first supporting film 120 and the second portion 124_2 with the adhesive layers 125_1 and 125_2. Deformation of the display device 260 into such a shape allows an apparent area of the display device 260 to be decreased maintaining at least the area of the display region 106 of the second array substrate 102_2.

Similar to the stacked body of the display device 100, internal stress exists in the first array substrate 102_1 and the second array substrate 102_2, which causes spontaneous deformation of the first array substrate 102_1 and the second array substrate 102_2 with a temperature change when these substrates are spaced from each other. However, since the display device 260 has the symmetrical plane in a plane parallel to the main surfaces of the first array substrate 102_1 and the second array substrate 102_2, the force of deformation is counterbalanced. As a result, the spontaneous deformation of the display device 260 with a temperature change is suppressed. Therefore, implementation of the present embodiment allows the display device 260 to be provided with a shape intended by a user, by which a display device with excellent handleability can be produced.

Fifth Embodiment

In the present embodiment, a structure of an electronic device 270 having the plurality of display devices 260 is explained. An explanation of the structures the same as or similar to those described in the First to Fourth Embodiments may be omitted.

Figure 15:
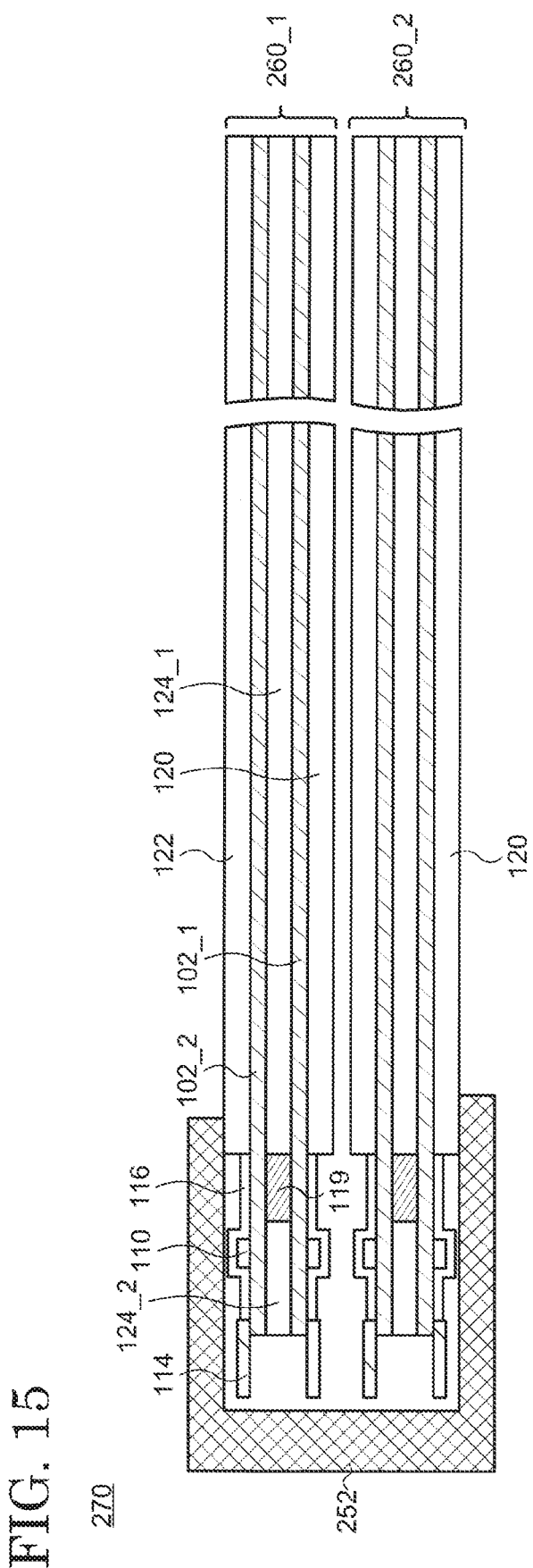
FIG. 15 is a schematic cross-sectional view of an electronic device according to an embodiment.

As shown in FIG. 15, the electronic device 270 has the plurality of display devices 260 connected to the connectors 114. The plurality of display devices 260 are arranged so that the display regions 106 thereof overlap with one another. The electronic device 270 further possesses the housing 252, and the housing 252 is provided so as to cover the connectors 114, the second portions 124_2 of the third films 124, the spacers 119, and the like. A part of the housing 252 may cover or be in contact with the second supporting film 122 of one display device 260_1 and the first supporting films 120 of the other display device 260_2. The number of the display devices 260 included in the electronic device 270 is not limited, and three or more display devices 260 may be included.

As described above, each of the display devices 260 is able to display an image on both surfaces. Therefore, a user can handle the electronic device 270 like a book and enjoy a more natural feeling.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
an array substrate comprising a flexible substrate and a pixel circuit over the flexible substrate;
a first supporting film under the array substrate;
a second supporting film over the array substrate;
an adhesive layer under the first supporting film; and
a shape stabilizing film under the adhesive layer, the shape stabilizing film including a first film and a second film having a different thermal expansion coefficient respectively.

2. The display device according to claim 1,
wherein the first film and the second film are respectively a first metal film containing a first metal and a second metal film containing a second metal, and
the first metal and the second metal are independently selected from copper, nickel, zinc, manganese, iron, cobalt, aluminum, tin, lead, and silver.

3. The display device according to claim 2,
wherein an intermetallic compound or an alloy of the first metal and the second metal is included at an interface between the first film and the second film.

4. The display device according to claim 3,
wherein the intermetallic compound or the alloy is discontinuously distributed at the interface.

5. The display device according to claim 2,
wherein an oxide of the first metal or an oxide of the second metal is included at an interface between the first film and the second film.

6. The display device according to claim 5,
wherein the oxide of the first metal or the oxide of the second metal is discontinuously distributed at the interface.

7. The display device according to claim 1, further comprising a third metal film between the first supporting film and the shape stabilizing film,
wherein the third metal film is adhered to the first supporting film with a second adhesive layer.

8. The display device according to claim 7,
wherein the third metal film includes a metal selected from aluminum, copper, and iron.

9. The display device according to claim 1,
wherein a stack of the first supporting film, the array substrate, and the second supporting film is configured to be bent with increasing temperature so that the first supporting film is located inside with respect to the second supporting film, and
wherein the shape stabilizing film is configured to be bent with increasing temperature so that the second film is located inside with respect to the first film.

10. The display device according to claim 1,
wherein a stack of the first supporting film, the array substrate, and the second supporting film is configured to be bent with increasing temperature so that the first supporting film is located outside with respect to the second supporting film, and
wherein the shape stabilizing film is configured to be bent with increasing temperature so that the second film is located outside with respect to the first film.

11. An electronic device comprising:
a plurality of display devices and a housing, the plurality of display devices each comprising:

an array substrate including a flexible substrate and a pixel circuit over the flexible substrate;
a first supporting film under the array substrate;
a second supporting film over the array substrate;
an adhesive layer under the first supporting film;
a shape stabilizing film under the adhesive layer; and
a connector connected to the array substrate,
wherein the housing covers the connector, and
the shape stabilizing film has a first film and a second film over the first film, the first film and the second film having a different thermal expansion coefficient respectively in each of the plurality of display devices.

12. The electronic device according to claim 11,
wherein, in each of the plurality of display devices:
the first film and the second film are respectively a first metal film containing a first metal and a second metal film containing a second metal; and
the first metal and the second metal are independently selected from copper, nickel, zinc, manganese, iron, cobalt, aluminum, tin, lead, and silver.

13. The electronic device according to claim 12,
wherein an intermetallic compound or an alloy of the first metal and the second metal is included at an interface between the first film and the second film in each of the plurality of display devices.

14. The electronic device according to claim 13,
wherein the intermetallic compound or the alloy is discontinuously distributed at the interface.

15. The electronic device according to claim 12,
wherein an oxide of the first metal or an oxide of the second metal is included at an interface of the first film and the second film in each of the plurality of display devices.

16. The electronic device according to claim 15,
wherein the oxide of the first metal or the oxide of the second metal is discontinuously distributed at the interface.

17. The electronic device according to claim 11,
wherein the plurality of display devices each have a third metal film between the first supporting film and the shape stabilizing film, and
the third metal film is adhered to the first supporting film with a second adhesive layer in each of the plurality of display devices.

18. The electronic device according to claim 17,
wherein the third metal film includes a metal selected from aluminum, copper, and iron in each of the plurality of display devices.

19. The electronic device according to claim 11,
wherein, in each of the plurality of display devices:
a stack of the first supporting film, the array substrate, and the second supporting film is configured to be bent with increasing temperature so that the first supporting film is located inside with respect to the second supporting film; and
the shape stabilizing film is configured to be bent with increasing temperature so that the second supporting film is located inside with respect to the first supporting film.

20. The electronic device according to claim 11,
wherein, in each of the plurality of display devices:
a stack of the first supporting film, the array substrate, and the second supporting film is configured to be bent with increasing temperature so that the first supporting film is located outside with respect to the second supporting film; and
the shape stabilizing film is configured to be bent with increasing temperature so that the second supporting film is located outside with respect to the first supporting film.

21. An electronic device comprising:
a first array substrate including a first flexible substrate and a pixel circuit under the first flexible substrate;
a second array substrate over the first array substrate, the second array substrate including a second flexible substrate and a pixel circuit over the second flexible substrate;
a first supporting film under the first array substrate;
a second supporting film over the second array substrate; and
a third supporting film between the first array substrate and the second array substrate,
wherein the third supporting film is adhered to the first array substrate and the second array substrate with adhesive layers on both sides of the third supporting film.

* * * * *